(12) United States Patent
Chen et al.

(10) Patent No.: US 6,946,728 B2
(45) Date of Patent: Sep. 20, 2005

(54) SYSTEM AND METHODS FOR HERMETIC SEALING OF POST MEDIA-FILLED MEMS PACKAGE

(75) Inventors: Chien-Hua Chen, Corvallis, OR (US); Charles C. Haluzak, Corvallis, OR (US); Donald Michael, Monmoth, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 7 days.

(21) Appl. No.: 10/783,849

(22) Filed: Feb. 19, 2004

(65) Prior Publication Data

US 2005/0184382 A1 Aug. 25, 2005

(51) Int. Cl.[7] ............................................. H01L 23/02
(52) U.S. Cl. ..................... 257/698; 257/678; 257/777; 257/778
(58) Field of Search .................. 29/840, 841; 257/678, 257/698, 777, 778

(56) References Cited

U.S. PATENT DOCUMENTS

| | | | |
|---|---|---|---|
| 5,578,869 A | 11/1996 | Hoffman et al. | |
| 5,596,486 A | 1/1997 | Young et al. | |
| 5,723,904 A * | 3/1998 | Shiga | 257/698 |
| 5,919,329 A * | 7/1999 | Banks et al. | 156/281 |
| 6,194,789 B1 | 2/2001 | Zhou | |
| 6,232,150 B1 | 5/2001 | Lin et al. | |
| 6,400,009 B1 | 6/2002 | Bishop et al. | |
| 6,436,853 B2 | 8/2002 | Lin et al. | |
| 6,441,481 B1 | 8/2002 | Karpman | |
| 6,481,570 B1 | 11/2002 | Henshall et al. | |
| 6,611,098 B2 | 8/2003 | Mori et al. | |
| 6,627,814 B1 | 9/2003 | Stark | |
| 6,635,509 B1 | 10/2003 | Ouellet | |
| 6,772,512 B2 * | 8/2004 | Tsai et al. | 29/840 |
| 2001/0021570 A1 | 9/2001 | Lin et al. | |
| 2002/0179921 A1 | 12/2002 | Cohn | |
| 2002/0185737 A1 | 12/2002 | Regan et al. | |
| 2003/0010808 A1 | 1/2003 | Uhland et al. | |
| 2003/0188881 A1 | 10/2003 | Stark | |

FOREIGN PATENT DOCUMENTS

WO  WO 96/30942  10/1996

* cited by examiner

Primary Examiner—David Nelms
Assistant Examiner—Dao H. Nguyen

(57) ABSTRACT

This invention provides a system and method for hermetically sealing a post media-filled package with a metal cap. The method can include the operation of filling a MEMS package through a fill port with at least one medium. A further operation can be plugging the fill port in the MEMS package with a sealant. Another operation can include depositing a metal cap over the sealant to hermetically seal the fill port.

18 Claims, 3 Drawing Sheets

US 6,946,728 B2

SYSTEM AND METHODS FOR HERMETIC SEALING OF POST MEDIA-FILLED MEMS PACKAGE

FIELD OF THE INVENTION

The present invention relates generally to the sealing of electronic packages. In particular, the present invention relates to hermetic sealing of post media-filled micro-electro-mechanical systems.

BACKGROUND

Packaging of micro-electro-mechanical systems (MEMS) is a complex and costly process. Unlike integrated circuits, which can be packaged in high volumes at costs of less than a penny per chip, packaging a MEMS device can cost in excess of 70% of the overall manufacturing cost. One reason for the complexity of packaging a MEMS device is the varying shape, size, and functionality of each device. A single package may contain a variety of technologies: optics, electronics, motion, chemistry, biology, and so forth. This diversity in technologies places extra demands on the packaging and sealing requirements. Each of the devices interacts with the environment in its own unique way. For example, one MEMS gyroscope may require a vacuum package to operate efficiently, while a different gyro device may require a special pressurized buffer gas atmosphere.

Physical limitations of the MEMS device in the package can limit the types of methods used to seal a MEMS package. Biological or chemical MEMS devices may involve fluids or gasses flowing through a MEMS device, requiring the MEMS package to have inputs, outputs, and possibly be open to the surrounding environment. Optical MEMS devices may require an open air package, or a translucent package that allows light to be transmitted to and from the device. Many MEMS devices include moving parts, thus requiring that the device have sufficient space within any packaging for the parts to move. Various media may be injected into the MEMS package before sealing. In order to keep the media in the package over a long period of time, hermetic sealing may be necessary.

Various methods are currently used to hermetically seal MEMS device packages. One method for hermetic sealing is selective induction heating and bonding, in which electrical currents are passed through the package at selected locations to heat the package locally to temperatures of over two thousand degrees. Although a large amount of this heat can be localized in the package, induction heating can cause a temperature of several hundred degrees at the MEMS device in the package. Depending upon the nature of the MEMS device, a temperature of several hundred degrees may damage the device. The heat can cause different materials used to construct the MEMS device to expand at different rates, placing thermal stress on the device and possibly cracking some materials. Further, the heat can cause expansion of media in the MEMS package causing further damage to the package and the MEMS device.

Ultrasonic bonding for MEMS hermetic packaging can overcome the heating problem caused by selective induction heating. However, the vibrational energy transferred to a MEMS package when using ultrasonic bonding can cause damage to the micro mechanical structures in the device. This is especially true when the MEMS device has multiple moving parts.

SUMMARY OF THE INVENTION

A method is disclosed for hermetically sealing a post media-filled package with a metal cap. The method can include the operation of filling a MEMS package through a fill port with at least one medium. A further operation can be plugging the fill port in the MEMS package with a sealant. Another operation can include depositing a metal cap over the sealant to hermetically seal the fill port.

DETAILED DESCRIPTION

Figure 1:
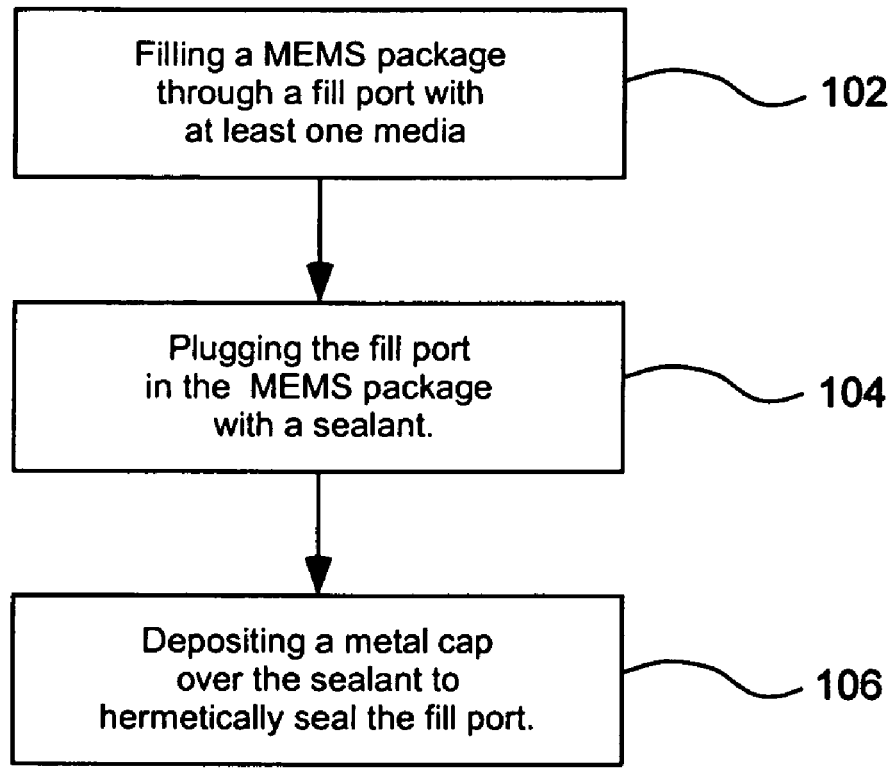
FIG. 1 is a flow chart depicting a method for hermetically sealing a post media-filled MEMS package with a metal cap in accordance with an embodiment of the present invention.
Figure 2A:
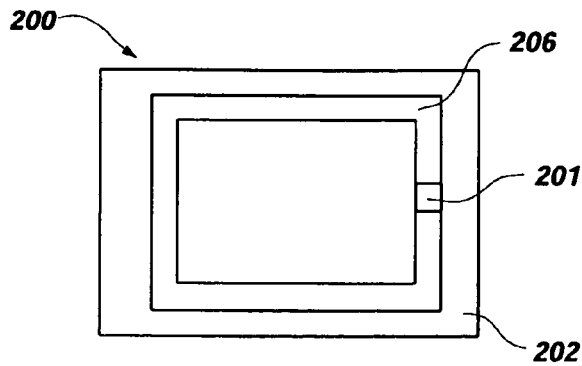
FIGS. 2A–D are diagrams showing a system for hermetically sealing a break in a bond ring of a post media-filled MEMS package with a metal cap in accordance with an embodiment of the present invention.
Figure 2B:
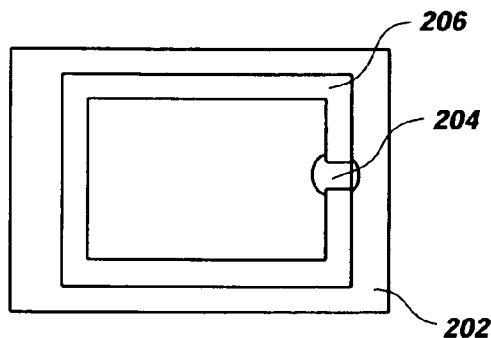
Figure 2C:
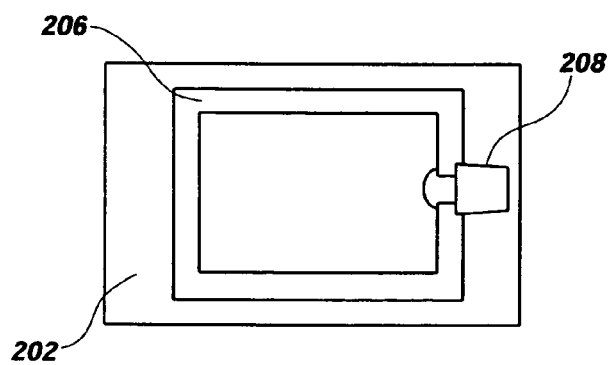
Figure 2D:
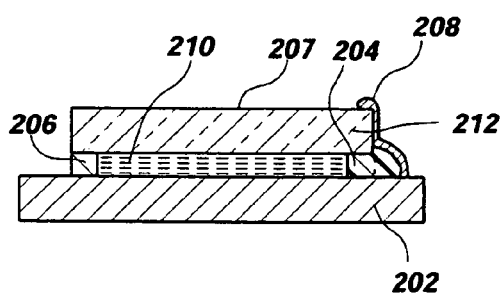
Figure 3A:
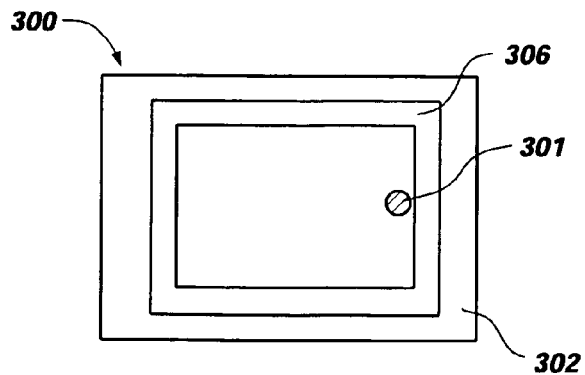
FIGS. 3A–D, are diagrams showing a system for hermetically sealing a fill port that is a through-hole in a lid of a post media-filled MEMS package with a metal cap in accordance with an embodiment of the present invention.
Figure 3B:
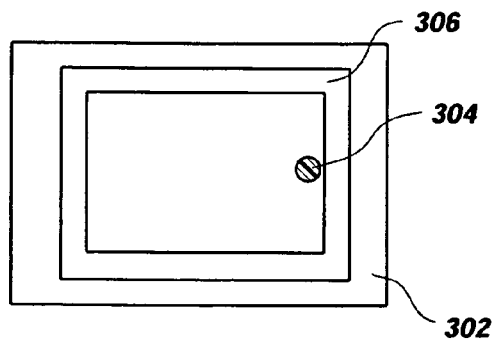
Figure 3C:
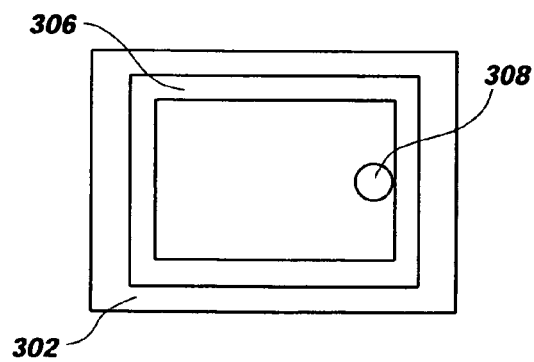
Figure 3D:
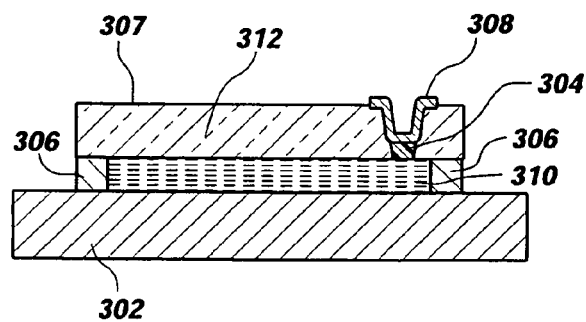

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

In order to overcome the problems described above and to provide an efficient system and method for hermetically sealing a MEMS device with minimal heating and vibrational damage, the present invention provides a system and methods for hermetic sealing of a post media-filled package with a metal cap as depicted in FIGS. 1–3. As used herein, "medium" and media refer to a gas, liquid or solid placed within the MEMS package or a vacuum created within the MEMS package in which substantially all of the atmosphere is evacuated from within the MEMS package.

The MEMS device may need a specific type of medium to contribute to and/or counteract heat dissipation, dampening, friction, contamination, oxidation effects, and so forth. One or more mediums can be used to accomplish this, specifically including gasses such as air, nitrogen, oxygen, or argon.

Stiction is another concern that may be resolved through the use of a medium when dealing with the extremely small size and weight of moving parts in a MEMS device. Stiction is the strong interfacial adhesion present between contacting microstructure surfaces. The media used in the MEMS package may be a fluid such as a low vapor pressure oil, a lubricant, or a hydrophobic fluid for use in anti-stiction applications. The fluid can also be selected to have a refractive index similar to that of the glass lid. The fluid may also be chemically altered so that the fluid's coefficient of thermal expansion is similar to that of the MEMS device die and/or package. Matching the fluid's coefficient of thermal expansion can further mitigate thermal expansion and stiction issues.

The media may also include getter material. Getters are materials which, when used in closed containers, reduce the gas or vapor content of the container. Getter material may be used to increase the vacuum in the container, or to help purify an atmosphere within the MEMS package.

The media may also be sol gel. Sol gel is a colloidal suspension of silica particles that is gelled to form a solid. The resulting porous gel can be chemically purified and consolidated at high temperatures into high purity silica.

Referring to FIGS. 2A–D, one embodiment of the present invention involving filling and sealing a MEMS package 200 is shown. The MEMS package 200 may include a MEMS device (not shown) mounted on a substrate 202 within an enclosure 207 with a bond ring 206 surrounding the MEMS device (not shown). The bond ring 206 may have a fill port 201 comprising a break in the bond ring 206. A lid 212 can be disposed above the bond ring 206 and sealed thereto. The bond ring 206 can be used to create a hermetic seal around the MEMS device. At least one medium 210 can be injected into the MEMS package 200 through a fill port 201 that is a break in the bond ring 206. The fill port can then be filled with a sealant 204. The sealant 204 can then be covered with a metal cap 208 to create an enclosure 207 within the MEMS package 200 that is hermetically sealed. The fill port 201 may also include a through-hole located in the MEMS device die (not shown).

Another embodiment of the present invention is shown in FIGS. 3A–D. The MEMS package 300 may include a MEMS device (not shown) mounted on a substrate 302 with a bond ring 306 surrounding the MEMS device. A lid 312 can be disposed above the bond ring 306 to be hermetically sealed thereto. The lid 312 may have a fill port 301 comprising a through hole in the lid 312. The lid may be made of glass or silicone. With the fill port 301 open, an assortment of media 310 can be used to fill the enclosure 307 of the MEMS package, depending upon the needs and structure of the MEMS device, as discussed above. After media fill, the fill port 301 in the lid 312 can be plugged with a sealant 304. The sealant 304 can then be cured and cleaned. A metal cap 308 can then be placed on top of the sealant 304 to create a hermetic seal in an enclosure 307.

Another embodiment of the invention provides a method for hermetically sealing a post media-filled micro-electro-mechanical system (MEMS) as depicted in the flow chart of FIG. 1. By way of example, the system disclosed in FIG. 2 will be referenced in connection with the method shown in FIG. 1. The method includes step 102, which involves filling a MEMS package 200 through a fill port 201 with at least one medium 210. A further operation is plugging the fill port 201 in the post media-filled MEMS package with a sealant 204, as shown in step 104. The sealant 204 may be an organic sealant such as epoxy, silicones, or spin-on polyamides. The epoxy may be a thermal-set epoxy, an ultraviolet set epoxy, or a two-part epoxy. The sealant may also be inorganic. Once the sealant 204 is applied, the MEMS package 200 may need to be heated to cure the sealant 204. However, curing sealants such as epoxy usually requires temperatures in excess of 100 degrees Celsius for a relatively long period of time. Applying high temperatures for a long period of time can cause failure of the MEMS device and adversely affect any media injected into the MEMS package. Therefore, low temperature curing sealants are desirable in many applications to plug the fill port 201. Low temperature sealants include ultraviolet set epoxy and two-part epoxy. Curing may also be accomplished through the use curing agents and accelerators such as ethylene amines and cycloaliphatics and/or a vacuum used to evaporate a substantial portion of the solvents from the sealant 204. The MEMS package 200 can then be cleaned of any unneeded sealant. Due to the nature of low temperature sealants, the MEMS package 200 is not hermetic at this point since all low temperature sealants leak to some extent and can also be permeable to moisture.

Another operation is depositing a metal cap 208 over the sealant, as shown in step 106. The metal cap 208 can be deposited such that the edges of the metal cap 208 extend beyond the adhesive and adhere entirely to the substrate 202. The substrate 202 and metal cap 208 can be joined through a molecular level bond and/or a mechanical bond created due to surface roughness. The bonding of the metal cap 208 to the substrate 202 can provide a hermetic seal.

The metal cap 208 may be a metal film deposited on top of the sealant 204 and substrate 202 through a shadow mask (not shown). A shadow mask is a metal plate with one or more holes in it that focuses an electron beam. The electron beam can be used to deposit the metal film in the areas in which the electron beam passes through the one or more holes in the metal plate. The one or more holes in the metal plate define a specific pattern in which the metal film will be deposited. A physical vapor deposition tool may also be used to deposit the metal film through a shadow mask. Thus, a shadow mask can be used to form a metal film in a specific pattern or area over the sealant 204 and a small portion of the substrate 202. The metal cap 208 may be formed using specific metals such as gold, titanium, silver, aluminum, chromium, tantalum, or compounds containing such metals. Covering the sealant 204 and a small portion of the substrate 202 with a metal cap 208 can create a hermetic seal, impermeable to gas and liquids. Thus, the MEMS device (not shown) within the enclosure 207 of the MEMS package 200 can be kept in a sustained environment that is best suited to the MEMS device.

The method herein described overcomes the problems of the prior art and provides an efficient method for hermetically sealing a MEMS device with minimal heating and vibrational damage. The present invention provides several advantages over the prior art. The method is an economical method for quickly packaging and hermetically sealing a MEMS device, while still allowing the device to function properly. The method uses a low temperature process that will not cause thermal damage to the MEMS device. The system and method in the present invention is faster and more economical than the methods used in the prior art.

What is claimed is:

1. A micro-electro-mechanical system (MEMS) package for hermetically sealing a MEMS device, comprising:
   the MEMS package having a fill port, wherein the fill port is a through hole capable of having at least one medium inserted through the fill port;
   at least one low temperature curing sealant placed within the fill port wherein the at least one low temperature curing sealant substantially fills the fill port; and
   a metal cap placed over the at least one low temperature curing sealant in a specific pattern wherein the metal cap substantially hermetically seals the fill port.

2. A MEMS package as in claim 1, further comprising a MEMS device placed within the MEMS package.

3. A MEMS package as in claim 2, further comprising a bond ring surrounding the MEMS device.

4. A MEMS package as in claim 3, wherein the fill port is located in a break in the bond ring.

5. A MEMS package as in claim 1, further comprising a lid disposed above the bond ring.

6. A MEMS package as in claim 5, wherein the fill port is a through-hole located in the lid.

7. A MEMS package as in claim 5, wherein the lid is selected from the group of materials consisting of glass and silicon.

8. A MEMS package as in claim 1, wherein the least one low temperature curing sealants placed within the fill port is an organic sealant selected from the group consisting of thermal-set epoxy, UV curable epoxy, two-part epoxy, silicone, and spin-on polyamides.

9. A MEMS package as in claim 1, wherein the at least one low temperature curing sealant is an inorganic sealant.

10. A MEMS package as in claim 1, wherein the at least one medium is a gas selected from the group of media consisting of air, nitrogen, oxygen, and argon.

11. A MEMS package as in claim 1, wherein the at least one medium is a liquid selected from the group of liquid media consisting of a low vapor pressure oil, a lubricant, and a hydrophobic fluid.

12. A MEMS package as in claim 11, wherein the liquid refractive index is similar to a lid refractive index.

13. A MEMS package as in claim 11, wherein the liquid has a coefficient of thermal expansion similar to that of the MEMS device.

14. A MEMS package as in claim 1, wherein the at least one medium is a solid selected from the group of solid media consisting of sol gel.

15. A MEMS package as in claim 1, wherein the at least one low temperature curing sealant is cured using a low temperature curing process, wherein the low temperature curing process occurs at a temperature less than 100 degrees Celsius.

16. A MEMS package as in claim 1, wherein the metal cap is formed over the at least one low temperature curing sealant using a low temperature process selected from the group consisting of electron beam deposition and physical vapor deposition.

17. A MEMS package as in claim 1, comprising a metal cap made from one or more types of metal, said one or more types of metal selected from the group consisting of gold, titanium, silver, aluminum, chromium, and tantalum.

18. A micro-electro-mechanical system (MEMS) package for hermetically sealing a MEMS device, comprising:
- a means for filling a MEMS package through a fill port with at least one medium;
- a means for plugging the fill port in the MEMS package with at least one low temperature curing sealant; and
- a means for hermetically sealing a metal cap in a specific pattern over the at least one low temperature curing sealant.

* * * * *